United States Patent
Groschopf et al.

(10) Patent No.: US 8,585,465 B2
(45) Date of Patent: Nov. 19, 2013

(54) PLANARIZATION OF A MATERIAL SYSTEM IN A SEMICONDUCTOR DEVICE BY USING A NON-SELECTIVE IN SITU PREPARED SLURRY

(75) Inventors: Johannes Groschopf, Radebeul (DE); Rico Hueselitz, Goeda (DE); Marco Kitsche, Dresden (DE); Katja Steffen, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 421 days.

(21) Appl. No.: 12/969,969

(22) Filed: Dec. 16, 2010

(65) Prior Publication Data

US 2011/0269381 A1  Nov. 3, 2011

(30) Foreign Application Priority Data

Apr. 30, 2010  (DE) .......................... 10 2010 028 461

(51) Int. Cl.
*B24B 1/00* (2006.01)

(52) U.S. Cl.
USPC .......... 451/54; 451/5; 451/8; 451/36; 451/41; 451/57; 451/58

(58) Field of Classification Search
USPC ............. 451/5, 8, 36, 41, 54, 57–58, 60, 65; 216/88, 89, 84; 438/692, 693, 8, 691; 252/79.1–79.5
See application file for complete search history.

(56) References Cited

U.S. PATENT DOCUMENTS

| | | | | |
|---|---|---|---|---|
| 4,192,059 | A | * | 3/1980 | Khan et al. .................... 438/287 |
| 5,603,654 | A | * | 2/1997 | Hayashi .......................... 451/36 |
| 5,664,990 | A | * | 9/1997 | Adams et al. .................. 451/60 |
| 5,679,063 | A | * | 10/1997 | Kimura et al. ................ 451/287 |
| 6,059,920 | A | * | 5/2000 | Nojo et al. ................. 156/345.12 |
| 6,120,354 | A | * | 9/2000 | Koos et al. ..................... 451/41 |
| 6,130,163 | A | * | 10/2000 | Yi et al. ........................ 438/692 |
| 6,165,048 | A | * | 12/2000 | Russ et al. ........................ 451/5 |
| 6,234,877 | B1 | * | 5/2001 | Koos et al. ..................... 451/41 |
| 6,358,125 | B2 | * | 3/2002 | Kawashima et al. ........... 451/60 |
| 6,407,445 | B1 | * | 6/2002 | Vashchenko et al. ......... 257/630 |
| 6,500,743 | B1 | * | 12/2002 | Lopatin et al. ................ 438/592 |
| 6,582,618 | B1 | * | 6/2003 | Toprac et al. ................... 216/59 |
| 6,722,953 | B2 | * | 4/2004 | Tanaka et al. .................. 451/41 |
| 6,746,314 | B2 | * | 6/2004 | Kim et al. ...................... 451/41 |
| 6,764,919 | B2 | * | 7/2004 | Yu et al. ........................ 438/421 |
| 6,793,837 | B2 | * | 9/2004 | Wenski et al. .................. 216/88 |
| 6,835,117 | B1 | * | 12/2004 | Wang et al. ....................... 451/8 |
| 6,875,089 | B2 | * | 4/2005 | Hall et al. ....................... 451/41 |
| 7,258,598 | B2 | * | 8/2007 | Iwasaki et al. ................. 451/41 |
| 8,247,281 | B2 | * | 8/2012 | Hempel et al. ................ 438/199 |

(Continued)

OTHER PUBLICATIONS

Translation of Official Communication from German Patent Application No. 10 2010 028 461.0-43 dated Dec. 6, 2010.

*Primary Examiner* — George Nguyen
(74) *Attorney, Agent, or Firm* — Williams, Morgan & Amerson, P.C.

(57) ABSTRACT

For complex CMP processes requiring the removal of different dielectric materials, possibly in the presence of a polysilicon material, a slurry material may be adapted at the point of use by selecting an appropriate pH value and avoiding agglomeration of the abrasive particles. The in situ preparation of the slurry material may also enable a highly dynamic adaptation of the removal conditions, for instance when exposing the polysilicon material of gate electrode structures in replacement gate approaches.

13 Claims, 5 Drawing Sheets

(56) References Cited

U.S. PATENT DOCUMENTS

| | | |
|---|---|---|
| 2002/0072238 A1 | 6/2002 | Peng et al. |
| 2002/0123224 A1 | 9/2002 | Lee et al. |
| 2002/0135015 A1* | 9/2002 | Chen et al. .................... 257/344 |
| 2003/0129542 A1* | 7/2003 | Shih et al. ..................... 430/311 |
| 2004/0100860 A1 | 5/2004 | Wilmer et al. |
| 2004/0203252 A1 | 10/2004 | Park |
| 2005/0205520 A1* | 9/2005 | Tsai ................................. 216/86 |
| 2006/0108326 A1* | 5/2006 | Dysard et al. ................... 216/88 |
| 2007/0060028 A1* | 3/2007 | Chen et al. ...................... 451/60 |
| 2009/0047870 A1* | 2/2009 | Siddiqui et al. ................. 451/36 |
| 2009/0163114 A1* | 6/2009 | Carpio .............................. 451/5 |
| 2010/0330790 A1* | 12/2010 | Hempel et al. ................. 438/585 |
| 2011/0230050 A1* | 9/2011 | Guo et al. ...................... 438/693 |

* cited by examiner

PLANARIZATION OF A MATERIAL SYSTEM IN A SEMICONDUCTOR DEVICE BY USING A NON-SELECTIVE IN SITU PREPARED SLURRY

BACKGROUND OF THE INVENTION

1. Field of the Invention

Generally, the subject matter disclosed herein relates to the field of manufacturing integrated circuits, and, more particularly, to chemical mechanical polishing (CMP) or generally planarizing processes and tools used for the formation of advanced semiconductor features, such as gate electrode structures, in which different materials have to be concurrently removed.

2. Description of the Related Art

The fabrication of modern integrated circuits requires a plurality of individual process steps involving the deposition of conductive, semiconductive or insulating layers on an appropriate substrate. After the deposition of one or more materials, device features are produced by patterning or otherwise treating the materials with well-known means, such as photolithography and etching. As a consequence, by patterning a material layer or layer system, typically, a certain topography will be created that also affects deposition and patterning of subsequent layers. Since sophisticated integrated circuits require the formation of a plurality of subsequent levels, it has become standard practice to periodically planarize the surface of the substrate so as to provide well-defined conditions for the deposition and patterning of subsequent material layers.

In this respect, CMP has become a widely used process technique for reducing imperfections in the substrate topography caused by preceding processes in order to establish enhanced conditions for a subsequent process, such as photolithography and the like. The polishing process itself causes mechanical damage to the polished surface, however, in an extremely low range, i.e., at an atomic level, depending on the process conditions. Chemical mechanical polishing typically requires a substrate to be attached to a carrier, a so-called polishing head, such that the substrate surface to be planarized is exposed and may be placed against a polishing pad. The polishing head and polishing pad are moved relative to each other by usually individually controlling the movements of the polishing head and the polishing pad. Typically, the head and pad are rotated against each other while the relative motion is controlled to locally achieve a target material removal rate. During the polishing operation, a slurry solution that may include a chemically reactive agent and abrasive particles is supplied to the surface of the polishing pad, thereby initiating a chemical reaction with the exposed surface material and also creating a physical removal component by the abrasive particles, which may preferably act on the reaction product generated by the chemical reaction.

One problem involved in the chemical mechanical polishing of substrates is the very different removal rates of differing materials, such as of a metal and a dielectric material, or dielectric materials of different type, or dielectric materials and semiconductive materials.

The different removal rates may, thus, contribute to a pronounced surface topography, wherein, typically, the material having the higher removal rate is increasingly recessed, which may, thus, result in inferior process conditions for subsequent processes and performance of structural features. For example, when removing excess metal from a dielectric material layer having incorporated therein metal regions, at a final stage of the removal process, the dielectric material is increasingly exposed so that, in this phase of the polishing process, typically metal and dielectric material are present, wherein a certain overpolish time may then result in a certain degree of "dishing" of the metal region due to the higher removal rate compared to the dielectric material. On the other hand, since a certain degree of overpolished time is typically required for completely removing the metal material across the entire substrate surface, a certain amount of the dielectric material may also be removed, however, in a pattern related manner, thereby also contributing to a non-planar surface topography after the end of the polishing process. A pattern dependent removal rate may typically be observed for areas having a different ratio of materials that have to be concurrently polished at a certain process stage. That is, in areas with a high density of, for instance, metal regions, the fraction of metal material to dielectric material is different compared to an area in which a reduced number of metal features per unit area is present.

Consequently, although the CMP process technique is per se a promising approach for globally providing a planar surface topography, the removal of a material may require a specifically designed slurry solution, thereby enabling an appropriate adaptation of the process conditions to the specific manufacturing phase of a semiconductor device for one specific material, while the slurry may be less appropriate for the removal of another material. For example, by using a specifically designed slurry solution in combination with appropriately selected process parameters, such as down force, relative speed and the like, highly selective polishing recipes may be established, which may be advantageous for removing a material having a pronounced surface topography relative to an underlying material, which may act as a stop layer. For example, well-established and frequently used materials in semiconductor production are silicon dioxide and silicon nitride. Since these materials typically exhibit different removal rates for presently well-established CMP recipes, a well controllable selective removal process may be performed on the basis of CMP. For example, when forming sophisticated shallow trench isolation regions, a silicon nitride layer may typically act as a hard mask material during the etching of isolation trenches in the silicon layer and may also act as an efficient CMP stop layer after refilling the isolation trenches with a silicon dioxide material upon removing any excess portion thereof In other situations, however, the different removal characteristics of silicon nitride and silicon dioxide may cause significant variations in device characteristics and may also negatively influence the further processing of complex semiconductor devices, in particular when even a third material has to be treated during a certain phase of the CMP process.

One important example for process conditions in which silicon nitride and silicon dioxide, in combination with a further material, may have to be removed in a highly non-selective manner is the exposure of a polysilicon material in a so-called replacement gate approach, which may frequently be used in sophisticated semiconductor devices, as will be explained in more detail with reference to FIGS. 1a-1c.

FIG. 1a schematically illustrates a cross-sectional view of a semiconductor device 100 in an advanced manufacturing stage. As illustrated, the device 100 may comprise a substrate 101 and a semiconductor layer 102, such as a silicon layer, in and above which are formed circuit elements 130, which may represent any circuit elements, such as transistors, capacitors, resistors, electronic fuses and the like. In the example shown, the circuit features 130 are illustrated in the form of gate electrode structures of field effect transistors. The gate electrode structures 130 typically comprise a gate dielectric material 131, such as a silicon dioxide based material, possibly in combination with a high-k dielectric material, and a polysilicon material 132. Furthermore, typically, a dielectric cap material 133 in the form of silicon nitride is provided above the material 132. Furthermore, a sidewall spacer structure 134, for instance comprised of silicon nitride, silicon dioxide and the like, is formed on sidewalls of the gate electrode structures 130.

The gate electrode structures 130 may represent sophisticated circuit features with a critical dimension, i.e., a length, in FIG. 1a, the horizontal extension of the electrode material 132, of 40 nm and less, while a height of the material 132 may be 50-100 nm and more, depending on the overall device and process requirements. Since the electric performance of the gate electrode structures 130 may no longer be appropriate for many types of performance driven field effect transistors, it has been proposed to replace the well-established materials silicon dioxide and polysilicon by more sophisticated material systems, such as high-k dielectric materials in combination with highly conductive electrode metals. Since the implementation of any such sophisticated material systems in an early manufacturing stage, i.e., upon forming the gate electrode structures 130, is very complex, in other approaches, the gate electrode structures 130 are formed on the basis of well-established materials and patterning strategies and at least the polysilicon material 132 is to be placed in a later manufacturing stage, i.e., after performing any high temperature treatments and other critical processes, which may otherwise result in a shift or variation of the electronic characteristics of sophisticated gate electrode structures. To this end, in some well-established strategies, an interlayer dielectric material 120 is typically provided above the gate electrode structures 130. For this purpose, well-established materials, such as silicon nitride and silicon dioxide, are frequently used, for instance in the form of a silicon nitride layer 121 that may act as an etch stop material during the further processing of the device 100 and which may also provide superior diffusion stopping capabilities, for instance in terms of avoiding copper diffusion into sensitive device areas upon forming a complex metallization system on the basis of copper and low-k dielectric materials. Furthermore, a silicon dioxide layer 122 is typically provided above the silicon nitride material 121 and provides the desired chemical and mechanical characteristics for passivating any circuit elements formed in and above the semiconductor layer 102. Consequently, depending on the density of gate electrode structures 130 and the geometry thereof, a more or less pronounced surface topography is created upon forming the interlayer dielectric material 120, thereby also requiring a certain degree of overfilling in order to reliably fill the spaces between the individual circuit elements 130.

The device 100 as illustrated in FIG. 1a may be formed on the basis of well-established process techniques including sophisticated lithography and etch techniques for patterning the gate electrode structures 130, followed by any further processes for forming drain and source regions of any appropriate profile in the semiconductor layer 102 associated with appropriate high temperature anneal processes. Thereafter, the materials 121 and 122 are deposited on the basis of well-established process techniques, such as plasma enhanced chemical vapor deposition (CVD) and the like. As discussed above, for a replacement gate approach, the polysilicon material 132 is to be exposed in order to enable an efficient removal of this material and the deposition of sophisticated gate materials, such as high-k materials, work function metals, highly conductive electrode metals and the like. In order to remove any excess portion of the interlayer dielectric material 120, typically a CMP process 110 or a sequence of CMP processes is applied. In a first step or phase of the process 110, the excess portion of the silicon dioxide material 122 is removed, which may be accomplished on the basis of well-established process recipes, for instance by using available standard slurry materials including silica particles as abrasive particles. On the basis of any such available slurry solutions, appropriate process conditions can be established in order to remove the material 122 at removal rates enabling a desired high controllability. Consequently, an efficient smoothing of the surface topography may be accomplished during the advance of the polishing process when removing a portion of the material layer 122.

FIG. 1b schematically illustrates the device 100 in an advanced stage of the process 110, in which increasingly the material of the silicon nitride layer 121 on top of the gate electrode structures 130 is exposed. Available slurry materials including silica, however, typically exhibit a much higher removal rate for silicon dioxide material and also for polysilicon material relative to the removal rate for silicon nitride material, which may be taken advantage of by using the silicon nitride material 121 as a stop layer. On the other hand, upon continuing the removal process on the basis of these slurry materials, the reduced removal rate of the silicon nitride material may require pronounced process times to remove the exposed portion of the layer 121 and to finally remove the dielectric cap material 133, which would result in undue recessing of the silicon dioxide material 122. It would, therefore, be desirable to continue the further removal process on the basis of substantially non-selective process conditions, which, however, may require a sophisticated slurry material that provides similar etch rates of silicon dioxide and silicon nitride, while at the same time, at a final phase of the removal process, polysilicon material also has to be removed to a certain degree in order to ensure a reliable exposure of the polysilicon material, since any nitride residues would unduly affect the further processing of the device.

It turns out, however, that the limited number of commercially available slurry solutions having a substantially matched removal rate for silicon dioxide and silicon nitride have to be used within a very narrow process window, thereby contributing to a reduced degree of controllability, since any small variations in process conditions may result in an overproportional deviation of the process result. Furthermore, the commercially available slurry solutions may show a pronounced dependence on the pattern density, that is, the removal rates may generally be different above densely packed device areas relative to less dense device regions.

FIG. 1c schematically illustrates a typical process result obtained on the basis of commercially available slurry solutions, wherein a certain degree of recessing may be observed in the polysilicon material 132 and, in particular, in the silicon dioxide material 122, which may negatively affect the further processing. For example, the recessing in the polysilicon material 132 may result in minute silicon nitride residues located at the edge of the gate electrode structures 130, which may cause an incomplete removal of the material 132 during the subsequent complex etch process. On the other hand, the recessing of the silicon dioxide material 122 may provide very sophisticated process conditions upon refilling the gate electrode structures 130 by metal materials and removing any excess metal from the gate electrode structures 130. In this case, the recessed areas in the silicon dioxide material may require excessive overpolish times in order to reliably remove any metal residues, thereby generally reducing the overall height of the gate electrode structures, while nevertheless a certain probability of leaving any metal residues and, thus, leakage paths may exist.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides process techniques and systems in which superior uniformity during a chemical mechanical planarization process may be obtained when treating a complex material system including at least two different dielectric materials. To this end, in some aspects disclosed herein, the slurry solution for performing the removal process may be adapted in a highly dynamic manner in order to provide substantially matched removal rates for the various materials of the complex material system. For example, a basic slurry solution may be appropriately modified at the point of use, that is, at or immediately prior to actually supplying the slurry solution, so that a wider degree of flexibility is available in appropriately designing the composition of the slurry solution without having to deal with long term stability and the like. Moreover, the inline or in situ preparing of the slurry solution may be used in sophisticated CMP systems in order to adjust the balance of the various removal rates on the basis of the current process status, thereby providing superior controllability of any complex removal processes, for instance in the context of a replacement gate approach.

It has been recognized that, in the caustic to neutral pH range, the removal rate of silicon dioxide strongly depends on both the pH value and the fraction of solid particles, i.e., abrasive particles, of the slurry solution, while, on the other hand, the removal rate of silicon nitride greatly depends on the fraction of particles in the solution and to a much lesser degree on the pH value. Consequently, the pH value of the slurry solution may represent an appropriate parameter for dynamically adjusting the removal rates of silicon nitride and silicon dioxide so as to be substantially equal. On the other hand, in some illustrative embodiments disclosed herein, a fine tuning of the removal rates may be accomplished by varying other characteristics of the resulting slurry solution, for instance the fraction of abrasive particles, the incorporation of a surfactant and the like, for otherwise constant process conditions.

One illustrative method disclosed herein relates to planarizing a surface of a semiconductor device in the presence of at least two different dielectric materials. The method comprises providing a first solution in a manufacturing environment, wherein the first solution has a first pH value and comprises abrasive particles. The method further comprises providing a second solution in the manufacturing environment, which comprises an acid. Additionally, the method comprises producing a slurry solution in the manufacturing environment from at least the first and second solutions, wherein the slurry solution has a second pH value that is less than the first pH value and wherein the second pH value results in an approximation of removal rates of the at least two different dielectric materials for a given percentage of the abrasive particles in the slurry solution in order to adjust a balance of the removal rates. Moreover, the method comprises performing a planarization process in the manufacturing environment using the slurry solution produced in the manufacturing environment.

A further illustrative method disclosed herein comprises producing a slurry solution with a matched removal rate for silicon dioxide and silicon nitride by adjusting a pH value and stabilizing the slurry solution so as to avoid agglomeration of abrasive particles of the slurry solution. The method further comprises performing a planarization process for removing at least silicon dioxide and silicon nitride from a semiconductor device by using the slurry solution so as to expose a polysilicon material of a gate electrode structure.

One illustrative chemical mechanical planarization system for concurrently removing at least two different dielectric materials from a single substrate comprises a process chamber configured to receive and hold in place the substrate, wherein the process chamber comprises a slurry supply unit. The system further comprises a first supply unit for providing a solution comprising abrasive particles. The system further comprises a second supply unit for providing a pH value adjusting solution comprising at least one of a surfactant and de-ionized water. The system further comprises a mixer unit connected to the first and second supply units and configured to produce a homogenous blend from the first solution and the pH value adjusting solution so as to provide a substantially matched removal rate for silicon dioxide material and silicon nitride material, wherein the mixer unit is operatively connected to the slurry supply unit.

BRIEF DESCRIPTION OF THE DRAWINGS

The disclosure may be understood by reference to the following description taken in conjunction with the accompanying drawings, in which like reference numerals identify like elements, and in which.

Figure 1A:
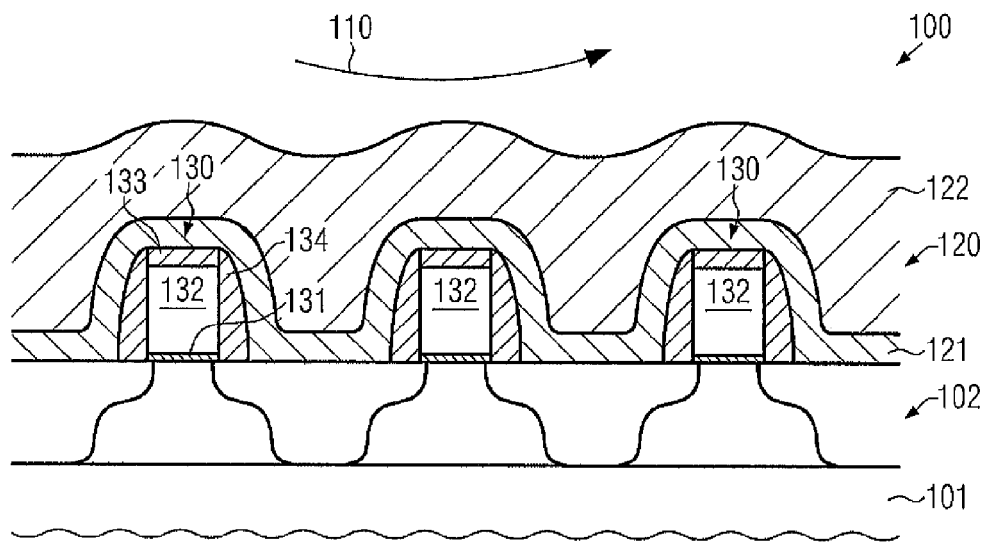
FIGS. 1a-1c schematically illustrate cross-sectional views of a conventional complex semiconductor device during various stages of a planarization process in a replacement gate approach based on a slurry solution with a significant imbalance with respect to the removal rates of silicon dioxide, silicon nitride and polysilicon.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure provides methods and systems in which a slurry solution may be prepared at the point of use, i.e., within a manufacturing environment, in which the slurry solution may also be used for performing a planarization process for concurrently removing at least two different dielectric materials, such as silicon dioxide and silicon based materials, possibly in the presence of a polysilicon material. To this end, the pH value may be used as the basic parameter for approximating the removal rates of silicon dioxide and silicon nitride material for otherwise given process conditions, thereby obtaining a balance or matching of these removal rates in a desired predefined range. For example, on the basis of adjusting the pH value, the removal rates may be selected to be substantially equal within the range of 10% or less, while a fine tuning of this balance or matching may then be accomplished by adjusting other parameters, such as the fraction of abrasive particles in the solution, i.e., the solid content of the slurry solution, the concentration of one or more types of surfactants or surface reactive agents and the like. In this manner, the slurry solution may be appropriately stabilized for the time of usage, without requiring long term stability, for instance in terms of particle agglomeration, inhomogeneities of the slurry solution and the like.

Moreover, by preparing the slurry solution at the point of use, a highly dynamic adaptation of the slurry characteristics may be accomplished, wherein a coarse adjustment of the removal rate balance based on the pH value may provide a stable global behavior of the slurry solution, while an efficient well controllable fine tuning may be accomplished by other parameters, for instance the fraction of abrasive particles and the like. In some illustrative embodiments, the control of the composition of the slurry solution and, thus, the balance of the different removal rates may be controlled on the basis of a status signal obtained from the polishing process, for instance in the form of an end point signal, thereby also enabling a very dynamic control regime during the polishing of each individual semiconductor device.

Figure 1B:
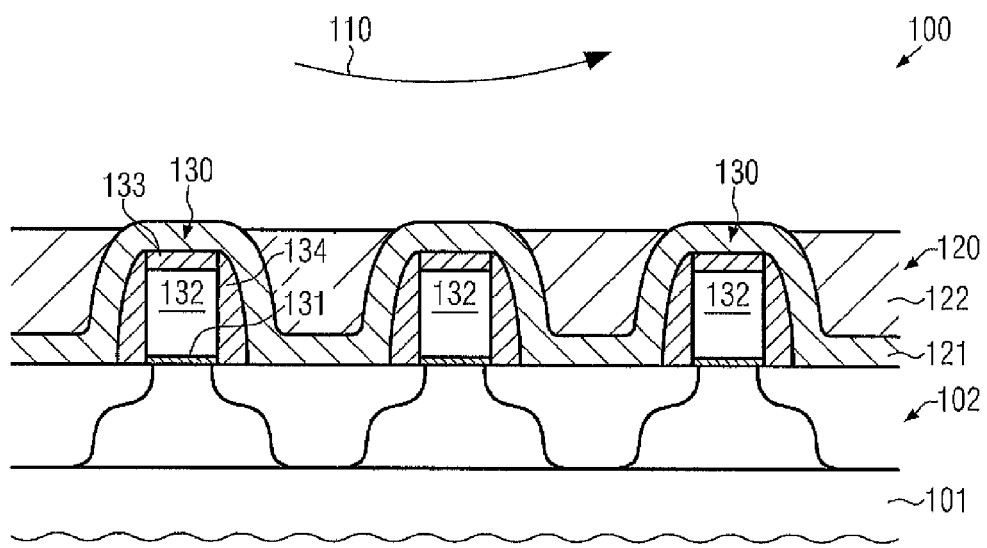
Figure 1C:
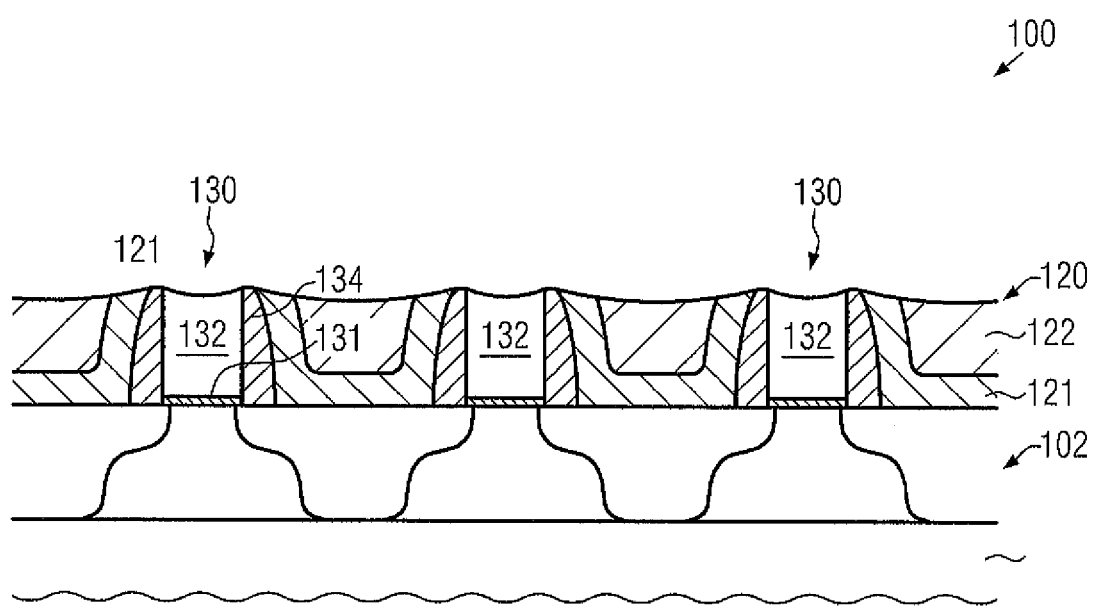

With reference to FIGS. 2a-2f, further illustrative embodiments will now be described in more detail, wherein reference also may be made to FIGS. 1a-1c, if appropriate.

Figure 2A:
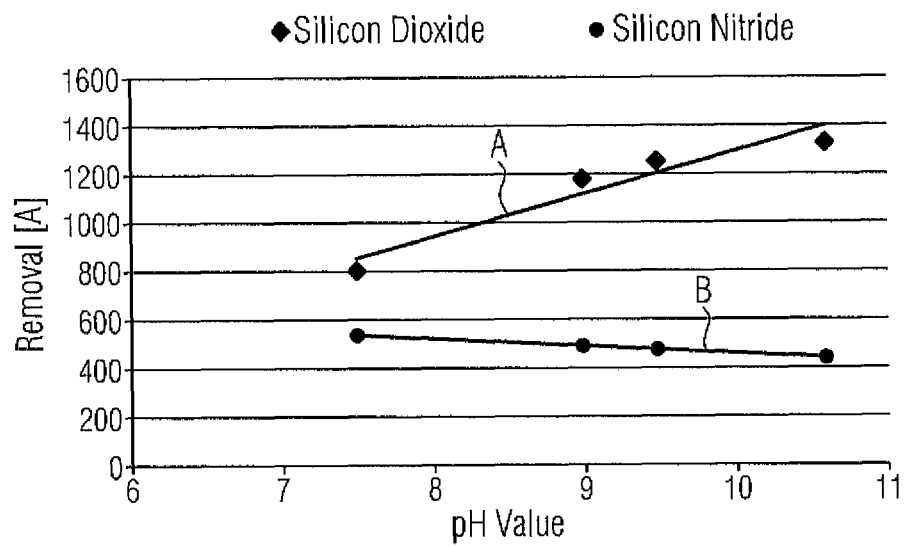
FIG. 2a schematically illustrates a graph indicating the dependency of the removal rates of silicon dioxide and silicon nitride versus the pH value of a slurry solution for a predefined percentage of abrasive particles.

FIG. 2a schematically illustrates a graph that describes the dependency of the removal rate over the pH value of a slurry solution for a percentage of abrasive particles in the slurry solution of 12%. As indicated above, a plurality of well-established slurry materials are available, for instance based on a caustic liquid component in combination with silica particles of specified average particle size. In FIG. 2a, the horizontal axis represents the pH value, while the vertical axis shows the removal rate in Angstrom per minute. It should be appreciated that the removal rate corresponds to typical process parameters in a CMP system, for instance with respect to down force and relative speed of a polishing pad and the surface to be polished. It is to be noted that a similar dependency may also be valid for any appropriate selection of these process parameters.

As shown, in the caustic to neutral pH range, the removal rate of silicon dioxide material, represented by curve A, strongly depends on the pH value, while the removal rate of silicon nitride material, represented by curve B, exhibits a much lesser degree of dependency on the pH value.

Figure 2B:
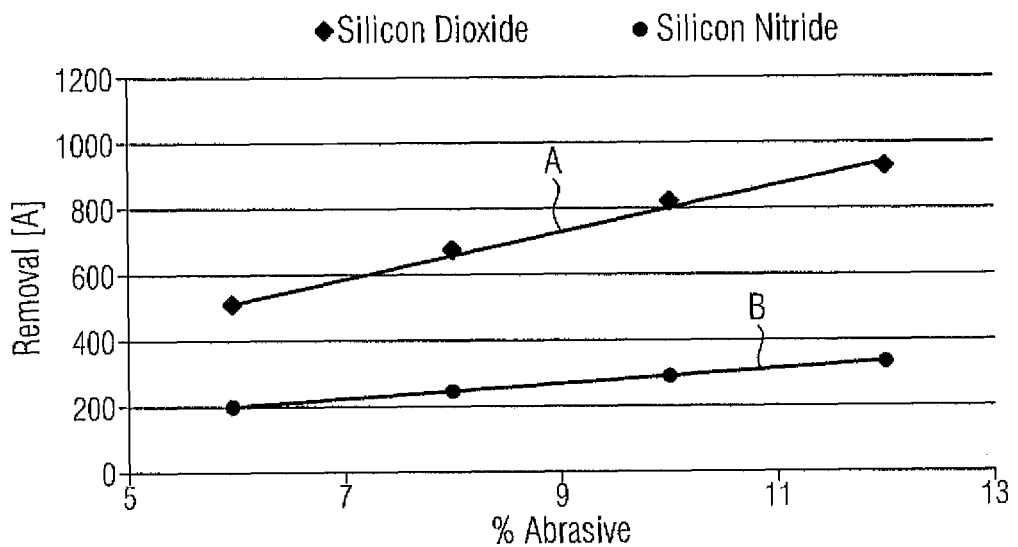
FIG. 2b schematically illustrates a graph indicating the dependency of the removal rates of silicon dioxide and silicon nitride with respect to a variation of the percentage of abrasive particles for a given pH value.

FIG. 2b schematically illustrates a graph representing the removal rates for a variation of the fraction of abrasive particles for a given pH value of 10.5. As illustrated, for a pH value of 10.5, the removal rate of silicon dioxide material, indicated as curve A, also strongly varies with a variation of the percentage of abrasive particles. Similarly, the removal rate of silicon nitride, represented by curve B, exhibits a pronounced correlation, however, to a somewhat lesser degree compared to silicon dioxide material. Consequently, by appropriately reducing the pH value for a given percentage of abrasive particles, the removal rate may be approximated for silicon dioxide and silicon nitride so as to be substantially equal, thereby obtaining a balanced or matched removal behavior of these materials.

Figure 2C:
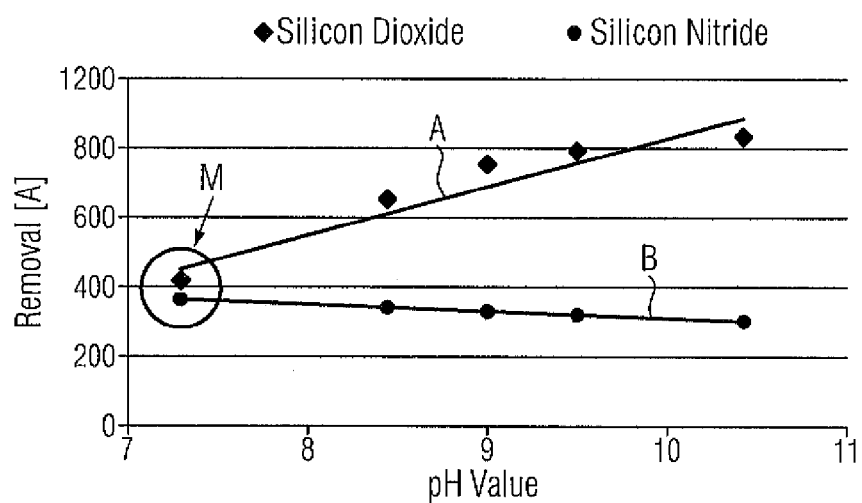
FIG. 2c schematically illustrates the dependency of the removal rates of silicon dioxide and silicon nitride for a reduced percentage of abrasive particles with respect to the pH value in order to establish a desired balance or matching between these removal rates, according to illustrative embodiments.

FIG. 2c schematically illustrates the removal rate of these materials for various pH values in order to identify an appropriate range, indicated as M, in which the removal rates, indicated by A and B, may be balanced or matched within a specified range, which is to be understood as a state in which a difference in the removal rate may be less than approximately 10% of the greater one of the removal rates. For example, in FIG. 2c, a pH value of 7.2 may result in a removal rate of approximately 420 Å for the silicon dioxide material, while the removal rate of silicon nitride may be approximately 390 Å so that, in this case, a balance or degree of matching may be obtained in which a difference in removal rates is less than 10% of removal rate of silicon dioxide. It should be appreciated that, in FIG. 2c, the slurry solution is used with a fraction of 8% abrasive particles.

As is evident from FIG. 2b, the fine-tuning of the balance in the range M and also a certain global shift of a pre-adjusted balance may be accomplished by varying the percentage of abrasive particles since generally both removal rates may be reduced by reducing the percentage of abrasive particles, wherein the slope of the removal rate of silicon dioxide is steeper compared to the slope of the removal rate of silicon nitride. Consequently, upon reducing the percentage of abrasive particles for a given pH value, the balance may be modified such that the ratio of the removal rates of silicon dioxide and silicon nitride may be reduced while, on the other hand, upon increasing the percentage of abrasive particles, the ratio may be increased, while generally the value of this ratio may be kept within a value range of, for example, 0.95-1.05. In this manner, the balance of the removal rates may be efficiently adjusted by varying the percentage of abrasive particles.

In some cases, the reduced pH value for defining an appropriate balance range, such as the area M of FIG. 2c, may result in a reduced degree of surface charging of the abrasive particles, which may be indicated by a very low zeta potential. In this case, the particles moving in the liquid component of the solution may tend to agglomerate, which, on the other hand, may result in a modified removal behavior during a planarization process. The tendency for agglomeration of the abrasive particles for a given pH value may be reduced by diluting the solution on the basis of de-ionized water. In this manner, the pH value may further be reduced, while at the same time the agglomeration point is shifted to an even lower pH value, thereby providing possibility of even further enhancing the degree of matching between the removal rates of silicon dioxide and silicon nitride.

For example, in FIG. 2c, the pH value may be reduced, for instance to a value of 6.5 or 7, while also reducing the point of agglomeration. Hence, a pH value may be identified by an intersection of curves A and B, without causing particle agglomeration, thereby indicating substantially equal removal rates.

Thus, according to some illustrative embodiments, the stabilization of the slurry material in terms of avoiding agglomeration of the abrasive particles may be accomplished by adjusting the pH value by using an acid for a caustic slurry base material and adding de-ionized water, which may thus result in an even reduced pH value and a shifted point of agglomeration.

As previously explained with reference to FIGS. 1a-1c, in complex planarization processes, a further material may also have to be removed with a similar or identical removal rate as silicon dioxide and silicon nitride, for instance when applying the removal process in a replacement gate approach. In this case, the polysilicon removal rate may be controlled by adding a surfactant to the slurry solution, wherein the concentration may be controlled so as to adjust the polysilicon removal rate, substantially without affecting the previously adjusted pH value, since only very small concentrations, i.e., less than 0.1 volume percent, of the surfactant may be required. Surfactants represent molecules having a hydrophobic component and a hydrophilic component, thereby modifying the surface or interface characteristics of particles in a solution. Hydrophobic components are typically hydrocarbon and may be aliphatic, aromatic or a mixture of both. On the other hand, the hydrophilic components may generally be of anionic, cationic or non-ionic nature so that a wide variety of appropriate surfactants is available. An appropriate concentration for a given surfactant may be readily determined on the basis of experiments in which, for instance, silicon dioxide and silicon nitride may be polished in the presence of a polysilicon material in order to determine a desired degree of matching of these removal rates. For example, when appropriately selecting the concentration of the surfactant, the degree of dishing of polysilicon material, as for instance shown in FIG. 1c for the material 132, may be significantly reduced so as to obtain a planar surface.

Moreover, the surfactant may also provide superior spatial stabilization of the abrasive particles in the slurry solution due to the modified interface characteristics of the particles. Additionally, in the presence of the surfactant at the surface of the abrasive particles, the oxide removal rate may be reduced to a certain degree, thereby enabling the selection of a somewhat higher pH value in order to obtain the desired matching between the removal rates of silicon dioxide and silicon nitride. That is, when referring to FIG. 2c, the range of desired balance or matching, indicated as M, may be obtained at a somewhat higher pH value, for instance for a value of 7.5 and higher, since the surfactant may, for otherwise identical parameters, reduce the oxide removal rate. Consequently, in this case, also the point of agglomeration for a given percentage of abrasive particles may be reduced, thereby further contributing to superior stability of the resulting slurry solution.

Figure 2D:
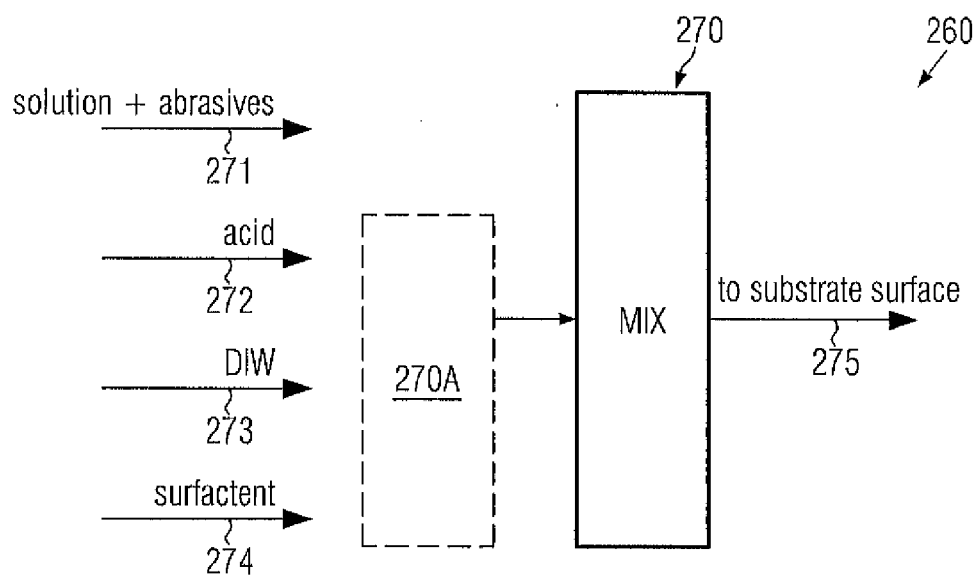
FIG. 2d schematically illustrates a strategy and system to dynamically provide a slurry solution with balanced or matched removal rates for silicon dioxide, silicon nitride and polysilicon within a specified manufacturing environment, according to illustrative embodiments.

FIG. 2d schematically illustrates a manufacturing environment 260, such as a semiconductor production line and the like, in which a slurry solution 275 may be prepared in line or in situ by a mixer unit 270, which may be appropriately configured to provide a substantially homogeneous blend of various components so as to finally output the appropriate slurry solution 275 when performing a planarization process within the manufacturing environment 260. In the embodiment shown, the mixer unit 270 may receive a solution 271 including a specified percentage of abrasive particles, wherein the solution 271 may represent a commercially available slurry material, for instance appropriate for the removal of silicon dioxide material or silicon nitride material, as previously discussed. For example, the solution 271 may represent a caustic liquid including a specified type of abrasive particles, which may have a specified average particle size and the like. Furthermore, the mixer unit 270 may be supplied with a process liquid including an acid 272 in order to appropriately reduce the pH value of the solution 271, if provided as a caustic solution. Moreover, the mixer unit 270 may receive any further process liquids 273, for instance in the form of deionized water and the like. Additionally, a source of a surfactant, indicated by 274, may be connected to the mixer unit 270. It should be appreciated that, in other cases, the solution 271 comprising the abrasive particles may be provided as a substantially neutral solution or as an acidic solution, while the liquid 272 for adjusting the pH value may be provided in the form of a caustic solution in order to achieve the desired pH value of the slurry solution 275. In some illustrative embodiments, two or more components may be mixed prior to being applied to the mixer unit 270, for instance on the basis of a unit 270A, which, in the embodiment shown, may receive the components 272, 273 and 274, which may be combined to an appropriate blend prior to adding the solution 271 comprising the abrasive particles. For example, the components 272, 273 and 274 may be prepared such that in combination with the component 271 the desired pH value and balance of removal rates may be obtained in the solution 275, thereby providing the possibility of acting on the abrasive particles, for instance by applying filters and the like, which would otherwise be difficult to be achieved on the basis of solution that already includes a surfactant.

For operating the mixer unit 270, appropriate reference data with respect to removal rates and the influence thereon with respect to the various components 271, 272, 273, 274 may be established in advance, for instance by performing experiments, and the mixer unit 270 may be controlled on the basis of this reference data so as to obtain the desired characteristics for the slurry solution 275. For example, as previously discussed, the percentage of abrasive particles may be readily varied by adjusting the ratio of solution flow of the component 271 and the combination of the components 272, 273, 274. If, for instance, a change of any other parameters, such as the pH value, is to be avoided, the fraction of acid and de-ionized water, for instance established in the unit 270A, may be appropriately adapted so as to take into consideration, for instance, a changed flow of the component 271. In other cases, the fraction of abrasive particles in the solution 271 may be controlled by other means, substantially without affecting the total liquid flow, for instance by providing appropriately filters and the like. In this manner, the characteristics of the slurry solution 275 may be adjusted in a highly dynamic manner, thereby enabling a dynamic adaptation of the process conditions, for instance, for switching from a highly selective removal behavior into a highly non-selective removal behavior, wherein the degree of non-selectivity may also be dynamically adjusted by controlling the mixer unit 270.

Figure 2E:
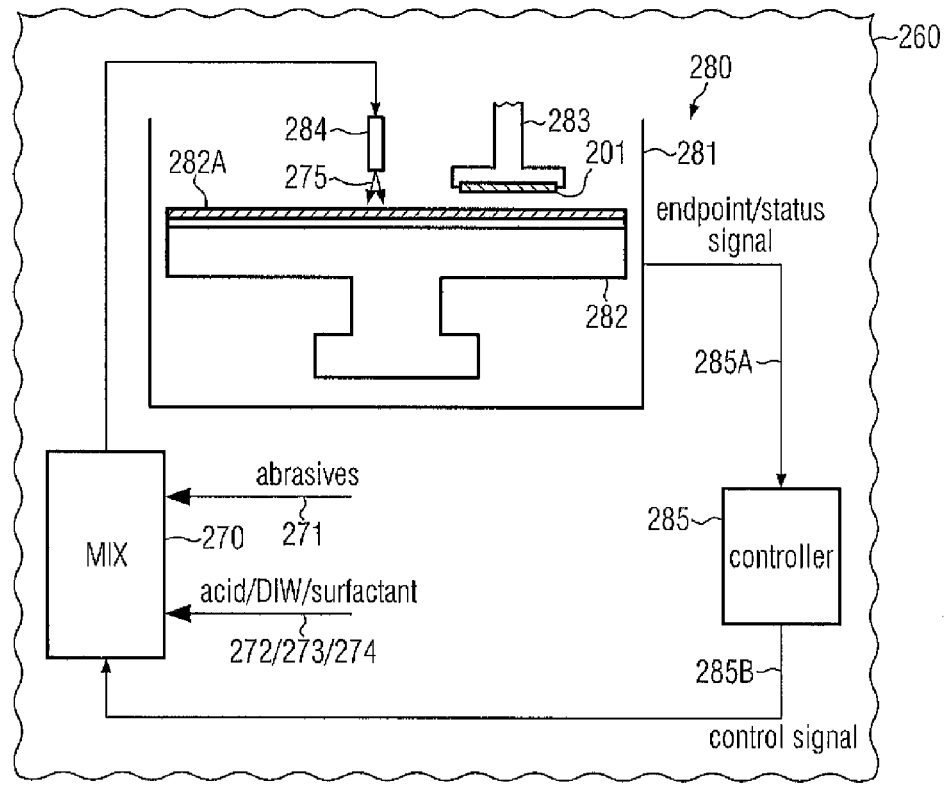
FIG. 2e schematically illustrates a planarization system configured to provide balanced removal rates for silicon dioxide, silicon nitride and polysilicon on the basis of an in situ prepared slurry solution, according to illustrative embodiments.

FIG. 2e schematically illustrates a system 280 for the chemical mechanical planarization or polishing of substrates which may be implemented in the manufacturing environment 260. As illustrated, the system 280 may comprise a process chamber 281 configured to receive and hold in place a substrate 201, for instance on the basis of a polishing head 283. Moreover, a polishing platen 282 may be provided in the chamber 281 in order to establish a relative motion between the substrate 201 and a polishing pad 282A provided on the platen 282. Furthermore, a slurry supply unit 284 may be provided and may be operatively connected to the mixer unit 270 so as to provide the slurry solution 275 to the polishing pad 282A.

It should be appreciated that the process chamber 281 and the components implemented therein may have any appropriate configurations required for performing a planarization process. Furthermore, the system 280 may comprise a control unit 285, which may be configured to control operation of the system 280 and may also be configured to receive a signal 285A from the process chamber 281, which may indicate the status of the process being performed in the process chamber 281 on the basis of the substrate 201. For example, the status signal 285A may represent any type of end point signal, which may generally be understood as any type of signal in which a change of conditions may be identified. For example, optical signals may be obtained from the surface of the substrate 201 during the polishing process, wherein a significant change of the optical signal may indicate, for instance, the increasing exposure of a different material, which may result in a different optical response of the surface being polished. In other cases, in addition or alternatively, other signals may be obtained, for instance a signal indicative of the friction of the polishing head 283 or of any other component, such as a pad conditioner (not shown), in order to indicate the status of the polishing process. Based on the status signal 285A, the control unit 285 may provide an appropriate control signal 285B supplied to the mixer unit 270, thereby causing the mixer unit 270 to prepare the composition of the slurry solution 275 in correlation with information contained in the control signal 285B. For example, upon detecting a significant change in materials in the surface being polished, the controller 285 may cause the mixer 270 to dynamically change the characteristics of the slurry, for instance changing from a substantially selective slurry to a substantially non-selective slurry by using an appropriate mixture, as described above.

Figure 2F:
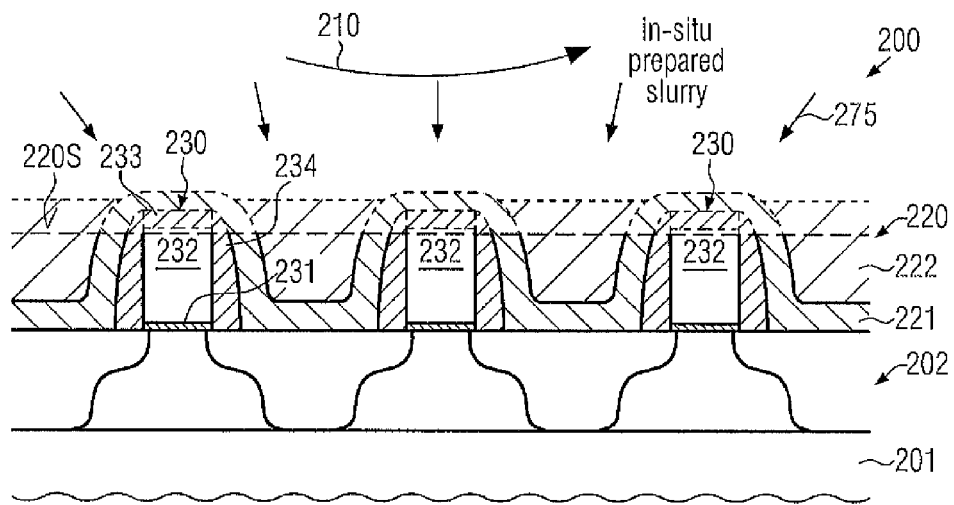
FIG. 2f schematically illustrates a cross-sectional view of a semiconductor device during a removal process for exposing polysilicon material in a replacement gate approach, according to further illustrative embodiments.

FIG. 2f schematically illustrates a cross-sectional view of a semiconductor device 200 comprising the substrate 201, which may have formed in and above a semiconductor layer 202, a plurality of circuit features 230, such as conductive lines, gate electrode structures and the like. For example, the circuit elements 230 may represent gate electrode structures comprising a polysilicon material 232 in combination with a dielectric cap material 233, such as a silicon nitride material. Furthermore, a dielectric material system 220 may be provided and may comprise, for instance, a silicon nitride material 221 and a silicon dioxide material 222. With respect to any characteristics of materials and process techniques for forming the semiconductor device 200, the criteria may apply as previously explained with reference to the semiconductor device 100. Thus, the gate electrode structures 230 may represent gate electrodes in which the material 232 is to be replaced by a sophisticated material system, as discussed above.

Furthermore, the device 200 may be subjected to a planarization process 210, which may, for instance, be performed on the basis of the system 280 as shown in FIG. 2e. Consequently, during the removal process 210, the slurry 275 may be provided so as to have appropriate characteristics, for instance for initially removing an excess portion of the silicon dioxide material 222, wherein a desired high removal rate for silicon dioxide material may be achieved. Upon exposing a portion of the dielectric material 221, the characteristics of the slurry solution 275 may be dynamically adapted on the basis of the concepts described above, thereby providing a matched removal rate for the materials 222 and 221. Consequently, during the further processing, these materials may be removed with a high degree of uniformity, irrespective of the pattern density, i.e., the number of circuit features 230 provided per unit area. Thus, as indicated by the dashed line 220S, finally the material 232 may be exposed on the basis of a superior surface topography, wherein, at the final phase of the removal process 210, the polysilicon material 232 may also be removed with a matched removal rate compared to the materials 221 and 222. Consequently, pronounced dishing of the material 232 may be avoided, and also a pronounced recessing of the dielectric material 222 may be suppressed. Moreover, as indicated above with reference to the system 280, the balance of removal rates during the process 210 may be dynamically adapted at any phase of the planarization process 210 so that superior process results may be achieved.

For example, if a status signal indicates that an increased removal rate for silicon nitride material may be required, for instance caused by a certain degree of erosion of the silicon dioxide material 222, a corresponding adaptation may be accomplished, for instance by adjusting the fraction of abrasive particles, as discussed above, in order to adjust or re-adjust the balance of the removal rates. For example, by reducing the fraction of abrasive particles, a relative increase of the silicon nitride removal rate may be accomplished, as the removal rate of silicon dioxide decreases more rapidly relative to the nitride removal rate. Similarly, if required, the removal rate of nitride may be reduced by increasing the fraction of abrasive particles.

As a result, sophisticated planarization processes, for instance in a replacement gate approach, may be performed on the basis of an in situ prepared slurry material, which may also provide the possibility of a highly dynamic control of the planarization process. On the other hand, long term stability of the slurry material may not be required due to the in situ preparation. Thus, well-established slurry-based solutions may be used and may be appropriately adapted for the planarization process under consideration, even in a highly dynamic manner, if required, thereby contributing to superior production yield and reduced production costs.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of planarizing a surface of a semiconductor device in the presence of a layer of silicon dioxide and a layer of silicon nitride, the method comprising:
    providing a first solution in a manufacturing environment, said first solution having a first pH value and comprising abrasive particles, wherein a percentage of said abrasive particles is between 6 weight percent and 9 weight percent;
    providing a second solution in said manufacturing environment, said second solution comprising an acid;
    producing a slurry solution in said manufacturing environment from at least said first and second solutions, said slurry solution having a second pH value between 6.5 and 8; and
    performing a planarization process in said manufacturing environment using said slurry solution produced in said manufacturing environment, wherein, when performing said planarization process using said slurry solution, a difference between a removal rate of said layer of silicon dioxide and a removal rate of said layer of silicon nitride solution is less than 10% of the removal range of said layer of silicon dioxide.

2. The method of claim 1, wherein said planarization process is performed in the presence of polysilicon.

3. The method of claim 1, wherein producing said slurry solution further comprises stabilizing said slurry solution so as to avoid agglomeration of abrasive particles at said second pH value.

4. The method of claim 3, wherein stabilizing said slurry solution comprises adding de-ionized water.

5. The method of claim 3, wherein stabilizing said slurry solution comprises adding a surfactant.

6. The method of claim 1, further comprising adjusting said difference between said removal rate of said layer of silicon dioxide and said removal rate of said layer of silicon nitride by dynamically varying said percentage of abrasive particles when producing said slurry solution.

7. The method of claim 6, further comprising obtaining a status signal when performing said planarization process and adjusting said difference between said removal rate of said layer of silicon dioxide and said removal rate of said layer of silicon nitride in correlation to said status signal.

8. The method of claim 1, further comprising forming said layer of silicon dioxide and said layer of silicon nitride above a gate electrode structure that comprises a semiconductor material and performing said planarization process so as to expose a surface of said semiconductor material.

9. A method of planarizing a surface of a semiconductor device in the presence of a layer of silicon dioxide and a layer of silicon nitride, the method comprising:
    providing a first solution in a manufacturing environment, said first solution having a first pH value and comprising abrasive particles, wherein a percentage of said abrasive particles is between 6 weight percent and 9 weight percent;
    providing a second solution in said manufacturing environment, said second solution comprising an acid;
    producing a slurry solution in said manufacturing environment from at least said first and second solutions, said slurry solution having a second pH value between 7 and 8; and
    performing a planarization process in said manufacturing environment using said slurry solution produced in said manufacturing environment while maintaining a concentration of abrasive particles within said slurry at a concentration level such that a ratio of a removal rate of said layer of silicon dioxide to a removal rate of said layer of silicon nitride falls within a range of 0.95-1.05.

10. The method of claim 9, wherein producing said slurry solution further comprises stabilizing said slurry solution so as to avoid agglomeration of abrasive particles at said second pH value.

11. The method of claim 10, wherein stabilizing said slurry solution comprises adding at least one of de-ionized water and a surfactant.

12. The method of claim 11, wherein at least said surfactant is added so as to further adjust a removal rate of said semiconductor material in said gate electrode structure.

13. The method of claim 9, wherein producing said slurry solution and said planarization process are performed in the same manufacturing environment.

* * * * *